United States Patent
Said et al.

(10) Patent No.: US 7,826,523 B2
(45) Date of Patent: Nov. 2, 2010

(54) EFFECTIVE ADAPTIVE FILTERING TECHNIQUES

(75) Inventors: Ahmed Said, Saratoga, CA (US); Elias J. Nemer, San Jose, CA (US); Gregory R. Goslin, Los Gatos, CA (US)

(73) Assignee: Intel Corporation, Santa Clara, CA (US)

( * ) Notice: Subject to any disclaimer, the term of this patent is extended or adjusted under 35 U.S.C. 154(b) by 776 days.

(21) Appl. No.: 11/395,412

(22) Filed: Mar. 31, 2006

(65) Prior Publication Data

US 2007/0230554 A1 Oct. 4, 2007

(51) Int. Cl.
- H03H 7/30 (2006.01)
- H04L 27/06 (2006.01)
- H04B 1/10 (2006.01)

(52) U.S. Cl. .................. 375/232; 375/233; 375/340; 455/295

(58) Field of Classification Search .......... 375/232, 375/340, 233; 455/295
See application file for complete search history.

(56) References Cited

U.S. PATENT DOCUMENTS

| | | | | |
|---|---|---|---|---|
| 4,466,132 A | * | 8/1984 | Namiki | 455/295 |
| 5,467,374 A | * | 11/1995 | Chennakeshu et al. | 375/340 |
| 5,537,443 A | * | 7/1996 | Yoshino et al. | 375/340 |
| 5,640,417 A | * | 6/1997 | Barabash et al. | 375/222 |
| 5,909,384 A | * | 6/1999 | Tal et al. | 708/322 |
| 6,135,952 A | * | 10/2000 | Coetzee | 600/336 |
| 6,366,613 B2 | * | 4/2002 | Sommer et al. | 375/232 |
| 6,501,329 B1 | * | 12/2002 | Petrofsky et al. | 327/552 |
| 6,907,065 B2 | * | 6/2005 | Kim | 375/233 |
| 7,180,942 B2 | * | 2/2007 | Chung et al. | 375/233 |
| 7,280,160 B2 | * | 10/2007 | Lee et al. | 348/620 |
| 2003/0191601 A1 | * | 10/2003 | Lai | 702/117 |
| 2004/0091058 A1 | * | 5/2004 | Tosato et al. | 375/261 |
| 2004/0190649 A1 | * | 9/2004 | Endres et al. | 375/326 |

OTHER PUBLICATIONS

International Search Report and Written Opinion for corresponding application No. PCT/US2007/064637, (Jul. 27, 2007), 10 pages.

* cited by examiner

*Primary Examiner* — Mohammad H Ghayour
*Assistant Examiner* — Sarah Hassan
(74) *Attorney, Agent, or Firm* — Kacvinsky Daisak PLLC

(57) ABSTRACT

A noise level of an input signal is determined by a noise calculation module. based on the noise level, a boundary setting module sets a reduced constellation boundary interval. This reduced constellation boundary interval is employed by an equalizer to perform adaptive equalization of the input signal.

18 Claims, 8 Drawing Sheets

EFFECTIVE ADAPTIVE FILTERING TECHNIQUES

BACKGROUND

Decision feedback equalizers can be employed in devices to correct the effects of signal multipaths and/or inter-symbol interference (ISI) on a received signal. However, in noisy environments, an equalizer can make erroneous decisions in the estimation of transmitted signals. Such decisions can cause improper symbol feedback within the equalizer and incorrect adaptation of the equalizer's filter coefficients. As a result, unstable equalizer performance may occur.

Currently, there is as lack of specific techniques or algorithms directed at attacking such harmful effects. Some equalizers can employ reduced constellation boundaries. Also, it has been contemplated to suspend the adaptation of an equalizer's filter coefficients when confidence in the equalizer's error signals (which can be a basis for such adaptation) is low. However, actual techniques based on such conjecture do not currently exist.

DETAILED DESCRIPTION

Various embodiments may be generally directed to effective adaptive filtering techniques. In one embodiment, for example, a noise calculation module determines a noise level of an input signal. Based on the noise level, a boundary setting module sets a reduced constellation boundary interval. This reduced constellation boundary interval is employed by an equalizer (adaptive filter) to perform adaptive equalization on the input signal. In this manner, the equalizer's performance is enhanced under higher noise levels (i.e., low signal-to-noise ratios). Other embodiments may be described and claimed.

Various embodiments may comprise one or more elements. An element may comprise any structure arranged to perform certain operations. Each element may be implemented as hardware, software, or any combination thereof, as desired for a given set of design parameters or performance constraints. Although an embodiment may be described with a limited number of elements in a certain topology by way of example, the embodiment may include more or less elements in alternate topologies as desired for a given implementation. It is worthy to note that any reference to "one embodiment" or "an embodiment" means that a particular feature, structure, or characteristic described in connection with the embodiment is included in at least one embodiment. The appearances of the phrase "in one embodiment" in various places in the specification are not necessarily all referring to the same embodiment.

Figure 1:
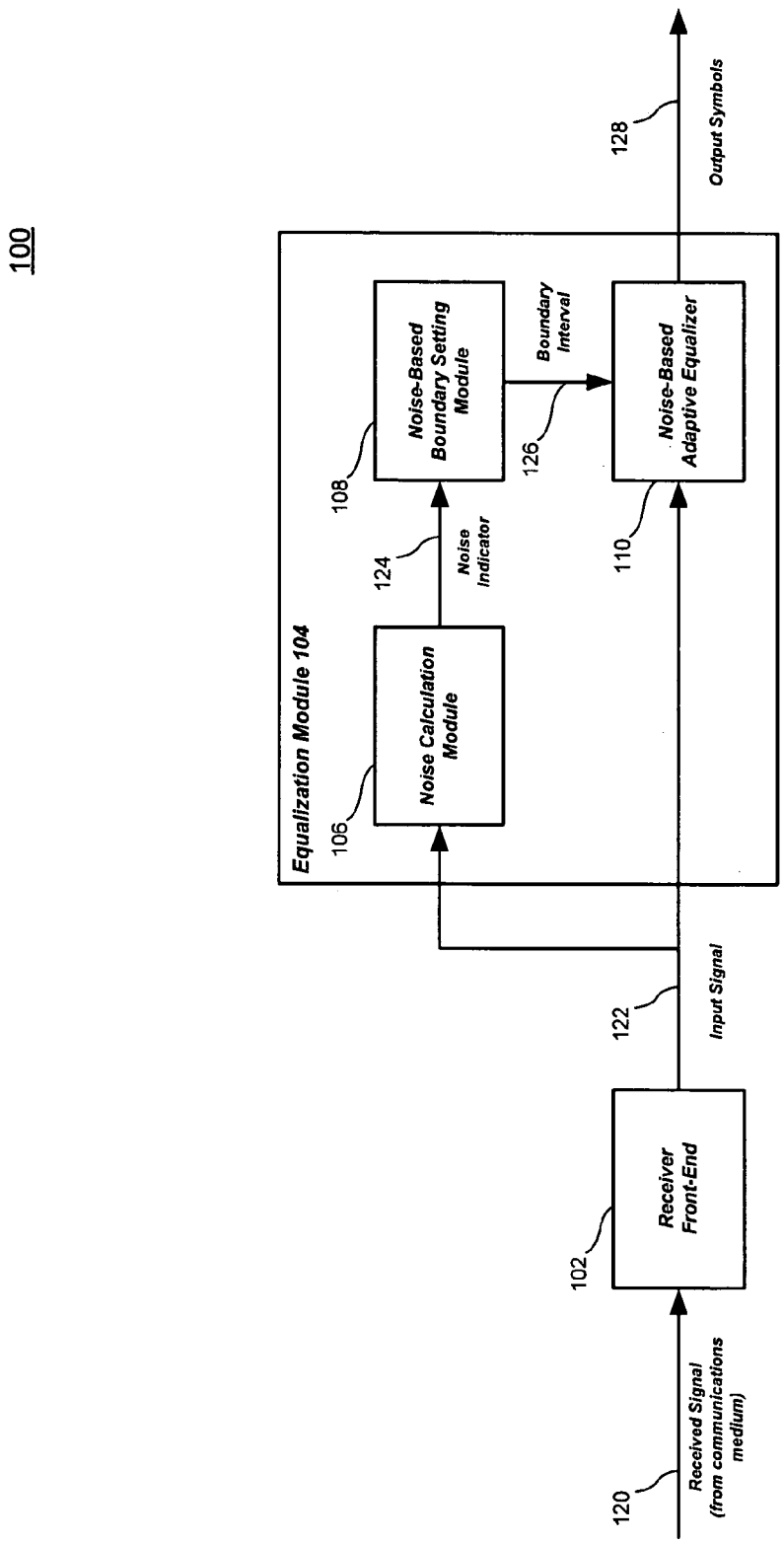
FIG. 1 is a diagram showing an embodiment of an apparatus.

FIG. 1 illustrates one embodiment of an apparatus. In particular, FIG. 1 illustrates a block diagram of an apparatus 100, which may include various elements. For instance, FIG. 1 shows that apparatus 100 may include a receiver front-end 102 and an equalization module 104. Further, FIG. 1 shows that equalization module 104 may include a noise calculation module 106, a noise based boundary setting module 108 (also referred to as boundary setting module 108), and a noise-based adaptive equalizer 110 (also referred to as equalizer 110). These elements may be implemented in hardware, software, or any combination thereof. The embodiments, however, are not limited to the elements shown in this drawing. For instance, embodiments may include greater or fewer elements, as well as other couplings between elements.

FIG. 1 shows that receiver front-end 102 may receive a signal 120 from a communications medium, which may be wired or wireless. Prior to its transmission across this communications medium, signal 120 may have been modulated according to one or more modulation schemes at various frequency range(s). Also, signal 120 may have been transmitted according to spread spectrum techniques, multiple access techniques, and/or other suitable transmission techniques.

As shown in FIG. 1, receiver front-end 102 produces an input signal 122 from signal 120. Input signal 122 may be a baseband signal, such as a pulse amplitude modulated (PAM) signal. Thus, to produce this signal, receiver front-end 102 may include a demodulator. Moreover, receiver front-end 102 may comprise other elements, such as down conversion components to translate signal 120 from high frequency ranges into lower frequency ranges (e.g., an intermediate frequency (IF) and/or baseband), one or more amplifiers (e.g., a low noise amplifier and/or a variable gain amplifier) to increase the energy of signal 120, and one or more filters to remove unwanted spectral components.

FIG. 1 shows that input signal 122 is sent to noise calculation module 106 and noise-based adaptive equalizer 110. Noise calculation module 106 determines or estimates a noise level, such as a signal-to-noise ratio (SNR), of signal 120. This determination may involve one or more computational operations. For example, a correlation calculation may be performed on a portion of signal 122 that is known beforehand, (such as a pilot signal, a preamble sequence, etc.) and a stored or internally generated signal corresponding to this portion. Such a correlation calculation yields a quantitative value having a magnitude that indicates the noise level (e.g., SNR) of signal 120. As a result of this determination, noise calculation module 106 generates a noise indicator 124, which is sent to boundary setting module 108.

Based on noise indicator 124, boundary setting module 108 may determine or set a reduced constellation boundary interval 126 to be employed by noise-based adaptive equalizer 110. Various techniques may be employed in setting the reduced boundary interval. For instance, boundary setting module 108 may store multiple boundary intervals, where each boundary interval corresponds to a particular noise level (e.g., SNR) range. This may be implemented, for example, as a look-up table (LUT). Thus, based on the value of noise indicator 124, boundary setting module 108 may select a corresponding stored boundary interval. The embodiments, however, are not limited to such techniques.

As shown in FIG. 1, noise-based equalizer 110 receives input signal 122 and generates output symbols 128, which may be either soft symbols or hard symbols. More particularly, equalizer 110 reduces undesirable characteristics from input signal 122, such as multipath effects and/or signal inter-symbol interference (ISI). Equalizer 110 may be adaptive in that its characteristics (e.g., various parameters) may change during operation. For instance, one or more filter coefficients, and/or various manners of operation may adapt based on input signal 122 and boundary interval 126. Such features may improve performance of equalizer 110 under SNR conditions.

Figure 2:
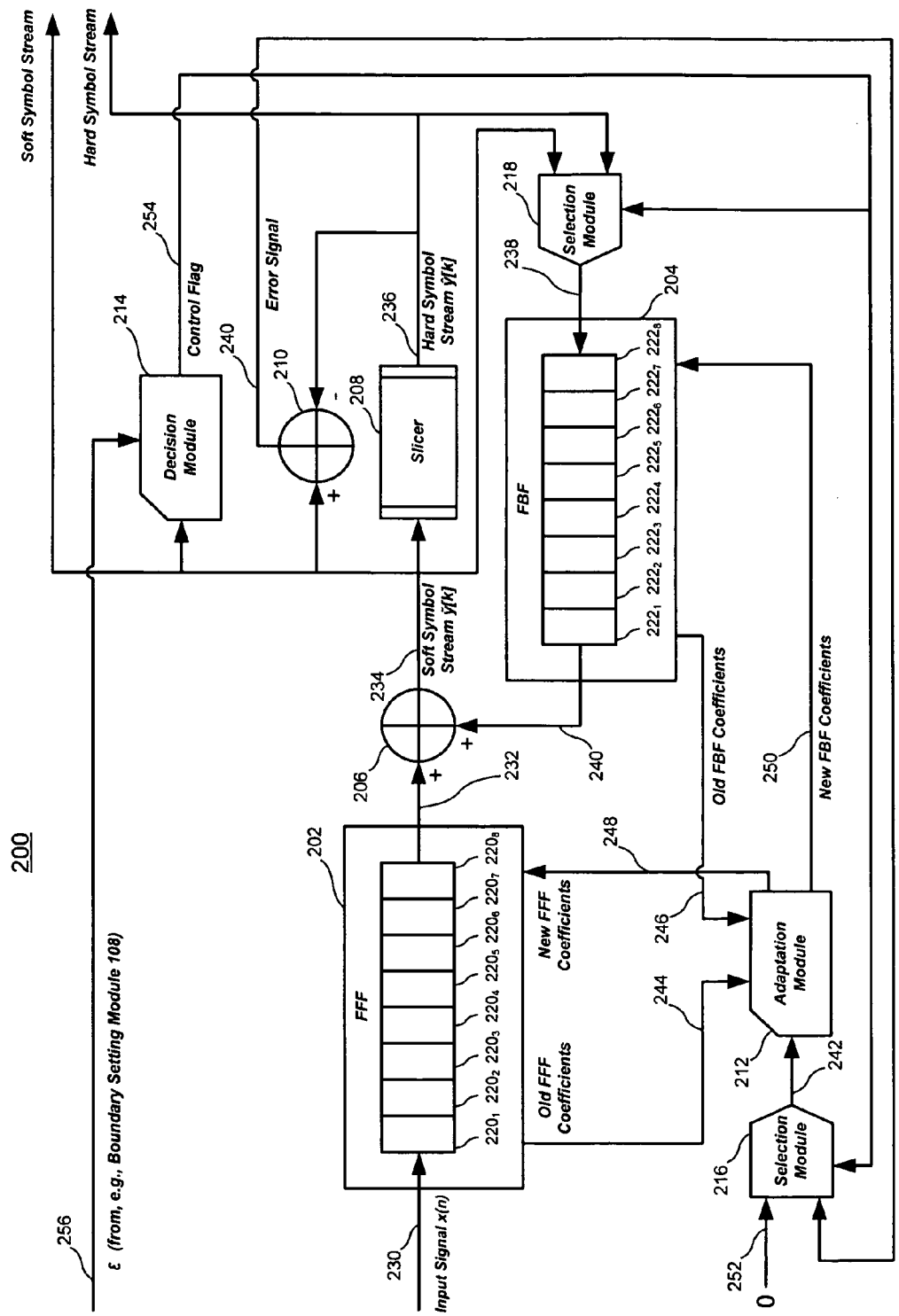
FIG. 2 is a diagram showing an implementation embodiment that may be included within an equalizer.

FIG. 2 shows an exemplary implementation embodiment 200 that may be included within noise-based adaptive equalizer 110. As shown in FIG. 2, this implementation may include various elements. However, the embodiments are not limited to these elements. For instance, embodiments may include greater or fewer elements, as well as other couplings between elements.

In particular, FIG. 2 shows that implementation 200 may include a feed forward filter (FFF) 202, a feed back filter (FBF) 204, a combining node 206, a slicer 208, a combining node 210, an adaptation module 212, a decision module 214, a first selection module 216, and a second selection module 218. These elements may be implemented in hardware, software, or any combination thereof.

As shown in FIG. 2, FFF 202 receives an input signal 230 (also shown as x(n)). With reference to FIG. 1, this signal may be input signal 122. FFF 202 may be implemented as a transversal filter, tapped delay line, or other suitable arrangement. Accordingly, FIG. 2 shows FFF 202 having a plurality of coefficients 220. Upon receipt of input signal 230, FFF 202 produces a corresponding output signal 232.

Like FFF 202, FBF 204 may also be implemented as a transversal filter, tapped delay line, or other suitable arrangement. Therefore, FBF 204 may include a plurality of taps 222. As shown in FIG. 2, FBF 204 may receive a feedback signal 238 and generate a corresponding output signal 240. This signal is described in greater detail below.

Signals 232 and 240 are combined (e.g., summed) at combining node 206. This produces a soft symbol stream 234 (also shown as ỹ[k]). As shown in FIG. 2, slicer 208 receives soft symbol stream 234 and converts it to a hard symbol stream 236 (also shown as ŷ[k]). More particularly, slicer 208 estimates transmitted symbols corresponding to input signal 230. This estimation is based on a set of boundaries, which may be specified by a reduced constellation boundary interval value 256. FIG. 2 shows that hard symbol stream 236 is sent to selection module 218.

Combining node 210 generates a slicer error signal 240 by calculating a difference between hard symbol stream 236 and soft symbol stream 234. This error signal is sent to selection module 216.

Adaptation module 212 sets coefficient values for FFF 202 and FBF 204. This may involve various schemes or algorithms, such as a least mean square (LMS) algorithm. Adaptation may be based on an error signal as well as previous and/or current filter coefficients. Accordingly, FIG. 2 shows adaptation module 212 receiving an input error signal 242 as well as old filter coefficients 244 and 246. Based on these inputs, adaptation module 212 generates new coefficients. In particular, FIG. 2 shows new coefficients 248 and 250 being sent to FFF 202 and FBF 204, respectively.

Equations (1) and (2), below, express a technique for updating FFF 202 and FBF 204 using LMS adaptation.

$$FFF_i[k+1] = FFF_i[k] - \mu_{DD} \cdot \{e[k]\} \cdot x[k-i] \quad (1)$$

$$FBF_j[k+1] = FBF_j[k] - \mu_{DD} \cdot \{e[k]\} \cdot \hat{y}[k-j] \quad (2)$$

In an ideal scenario having no additive white Gaussian noise (awgn), the coefficients of FFF 202 and FBF 204 will converge so that the calculated errors within slicer error signal 240 will be zero, and the coefficients converge to a fixed set, as expressed in Equations (3) and (4).

$$FFF_i[k+1] = FBF_i[k] \quad (3)$$

$$FBF_j[k+1] = FBF_j[k] \quad (4)$$

However, in real situations, even though the filters have converged, their coefficients will be stable except for residual errors that are due to awgn. As the noise level in input signal increase (as in the case of low SNR), estimated errors slicer error signal 240 will be wrong more often. This may cause the coefficients of FFF 202 and FBD 204 to change in the wrong direction, which leads to instability.

Adaptation module 212 receives error signal 242 from selection module 216. Based on a received control flag 254, this signal may be either error signal 240 or a "zero signal" 252. Selection module 218 also receives control flag 254. Based on this flag, selection module 218 sends either soft symbol stream 234 or hard symbol stream 236 to FBF 204. Selection modules 216 and 218 may be implemented with one or more multiplexers. However, the embodiments are not limited to such.

Details regarding control flag 254 are now provided. As shown in FIG. 2, control flag 254 is generated by decision module 214. This generation is based on soft symbol stream 234 and reduced constellation boundary interval value 256 (also shown as ε). With reference to FIG. 1, boundary interval value 256 may be received, for example, from boundary setting module 108. However, the embodiments are not limited to this context.

Decision module 214 determines whether soft symbols of soft symbol stream 234 are within reduced constellation boundaries, as specified by reduced constellation boundary interval value 256. When soft symbols are within these boundaries, then decision module 214 sets control flag 254 to designate an adaptation mode. However, when they are not, then decision module 214 sets control flag 254 to designate a no adaptation mode.

When control flag 254 designates the adaptation mode, selection module 216 sends slicer error signal 240 to FFF 202 as input error signal 242. Also, selection module 218 sends hard symbol stream 236 to FBF 204 as feedback signal 238. However, control flag 254 designates the no adaptation mode, then selection module 216 sends zero signal 252 to adaptation module 212 as input error signal 242, and selection module 218 sends soft symbol stream 234 to FBF 204 as feedback signal 238.

This feature prevents divergence from the removal of undesirable characteristics (e.g., multipath effects, ISI, etc.) in input signal 230. For instance, FBF 204 avoids processing hard symbols having a substantial probability of being incorrect. Also, adaptation module 212 does not generate new filter coefficients. This avoids new coefficients being based on incorrect hard symbol interpretations. Further description regarding these features is provided below with reference to FIGS. 4A through 6.

FIG. 2 shows that implementation 200 may output soft symbol stream 234 and/or hard symbol stream 236. For instance, these symbol streams may be sent to components (not shown) for further processing, such as error correction decoding, deinterleaving, and/or other suitable operations. Soft symbol stream 234 may be expressed as shown below in Equation (5).

$$\tilde{y}[k] = \sum_{i=1}^{N} FFF[i] \cdot x[k-i] + \sum_{j=1}^{M} FBF[j] \cdot FBF\_Memory[k-j] \quad (5)$$

Operations for the above embodiments may be further described with reference to the following figures and accompanying examples. Some of the figures may include a logic flow. Although such figures presented herein may include a particular logic flow, it can be appreciated that the logic flow merely provides an example of how the general functionality described herein may be implemented. Further, the given logic flow does not necessarily have to be executed in the order presented unless otherwise indicated. Also, the given logic flow may include additional operations as well as omit certain described operations. In addition, the given logic flow may be implemented by a hardware, software executed by one or more processors, or any combination thereof. The embodiments are not limited in this context.

Figure 3:
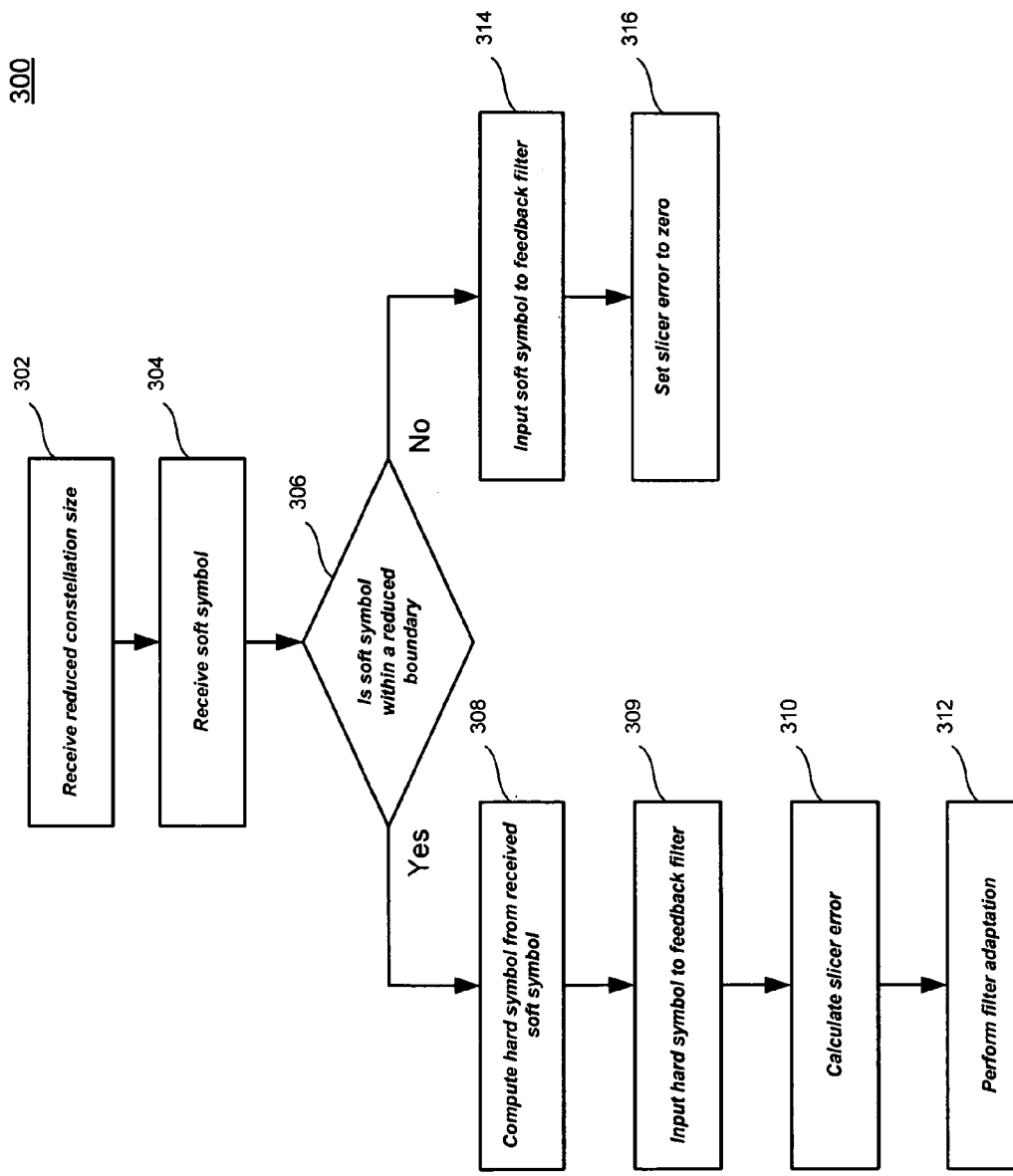
FIG. 3 illustrates an embodiment of a logic flow.

FIG. 3 illustrates one embodiment of a logic flow. In particular, FIG. 3 shows a logic flow 300, which may be representative of operations executed by one or more embodiments described herein. As shown in FIG. 3, a reduced constellation boundary interval, $\epsilon$, is set at a block 302. This boundary interval may be based on a calculated or estimated noise level (e.g., SNR) associated with a received signal. With reference to FIG. 1, $\epsilon$ may be set, for example, by boundary setting module 108.

At a block 304, a soft symbol is received. As indicated by a block 306, it is determined whether the soft symbol falls within a reduced boundary, as specified by $\epsilon$. If so, then operation proceeds to a block 308. However, if not, then operation proceeds to a block 314. These blocks may be performed, for example, by decision module 214.

At block 308, a hard symbol is determined from the received soft symbol. This computation may be performed, for example, by slicer 208. Then, at a block 309, the hard symbol is fed through a feedback filter, such as FBF 204.

As shown in FIG. 3, a slicer error is calculated at a block 310. As described above, this may involve calculating a difference between the hard symbol and the received soft symbol. After this calculation, operation may proceed to a block 312. At this block, filter adaptation may be performed.

As described above, operation proceeds to block 314 if the received soft symbol does not fall within a reduced boundary, as specified by $\epsilon$. At this block, the received soft symbol is fed through a feedback filter, such as FBF 204. Also, at a block 316, the slicer error is set to zero. As an example, this may be implemented as shown in FIG. 2, where selection module 216 selects zero signal 252 as input error signal 242 to prevent the generation of new coefficients.

Thus, techniques are provided for determining when an equalizer adapts its filter coefficients. This may be based, for example, on establishing when to ignore a slicer error because of its low probability of being correct. Such features may advantageously enhance equalization (adaptive filtering) under low SNR conditions. For instance, such features prevent divergence from the removal of undesirable characteristics (e.g., multipath effects, ISI, etc.) in input signal 230. Also, such features advantageously prevent divergence from the removal of undesirable characteristics (e.g., multipath effects, ISI, etc.) in input signal 230.

Figure 4A:
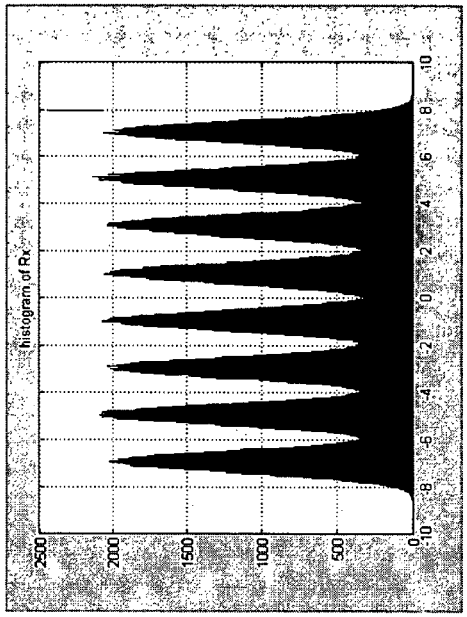
FIGS. 4A through 4D are graphs illustrating signal constellation characteristics at various noise levels.
Figure 4B:
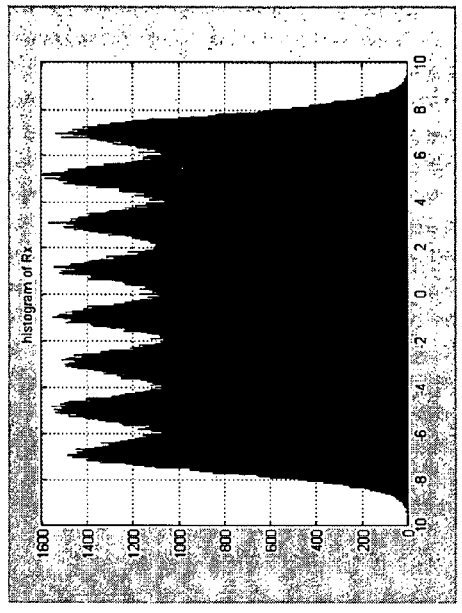
Figure 4C:
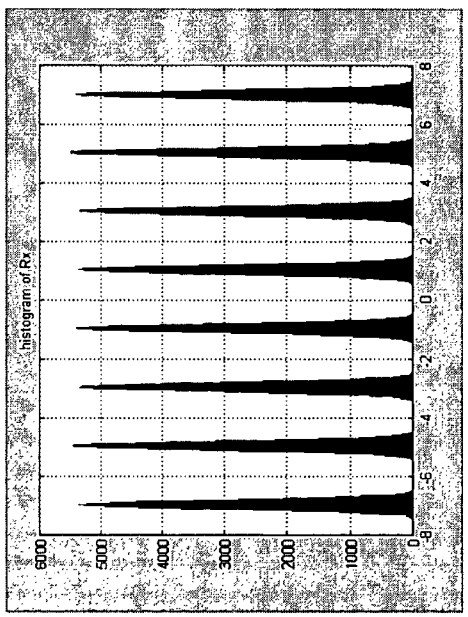
Figure 4D:
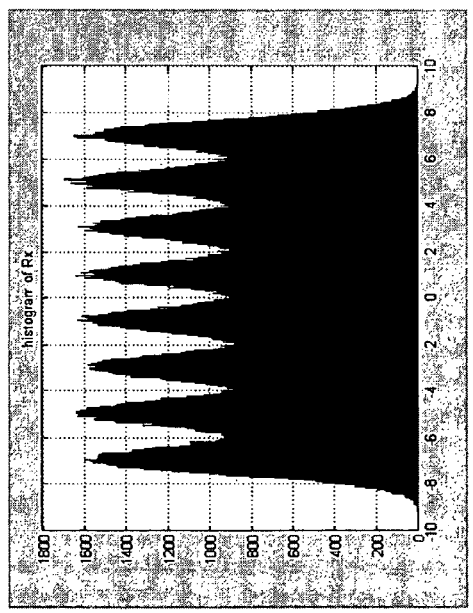

The description now turns to an analytical discussion of reduced constellation techniques. FIGS. 4A-4D illustrate various distributions associated with an eight level signal constellation. These drawings show exemplary received symbol distributions for an eight level vestigial sideband (8-VSB) constellation resulting from different noise levels (i.e., different SNRs). In particular, FIG. 4A shows distributions for an SNR of 30 decibels (dB), FIG. 4B shows distributions for an SNR of 20 dB, FIG. 4C shows distributions for an SNR of 17 dB, and FIG. 4D shows distributions for an SNR of 16 dB.

The only impairment associated with these symbol distributions is additive noise. Thus, other phenomena (e.g., multipath transmission, reflections, echoes, etc.) do not contribute to these illustrated distributions.

As shown in FIGS. 4A-4D, the received symbols each have a Gaussian distribution, centered at corresponding ideal transmitted levels. In this exemplary case, the ideal transmitted levels are −7, −5, −3, −1, 1, 3, and 5. The variances of these distributions (exhibited as width) are functions of the corresponding noise levels. More particularly, as the amount of noise increases (i.e., as the SNR decreases), the variance (width) increases. Thus, the probability of making incorrect decisions increases with the amount of noise.

Figure 5:
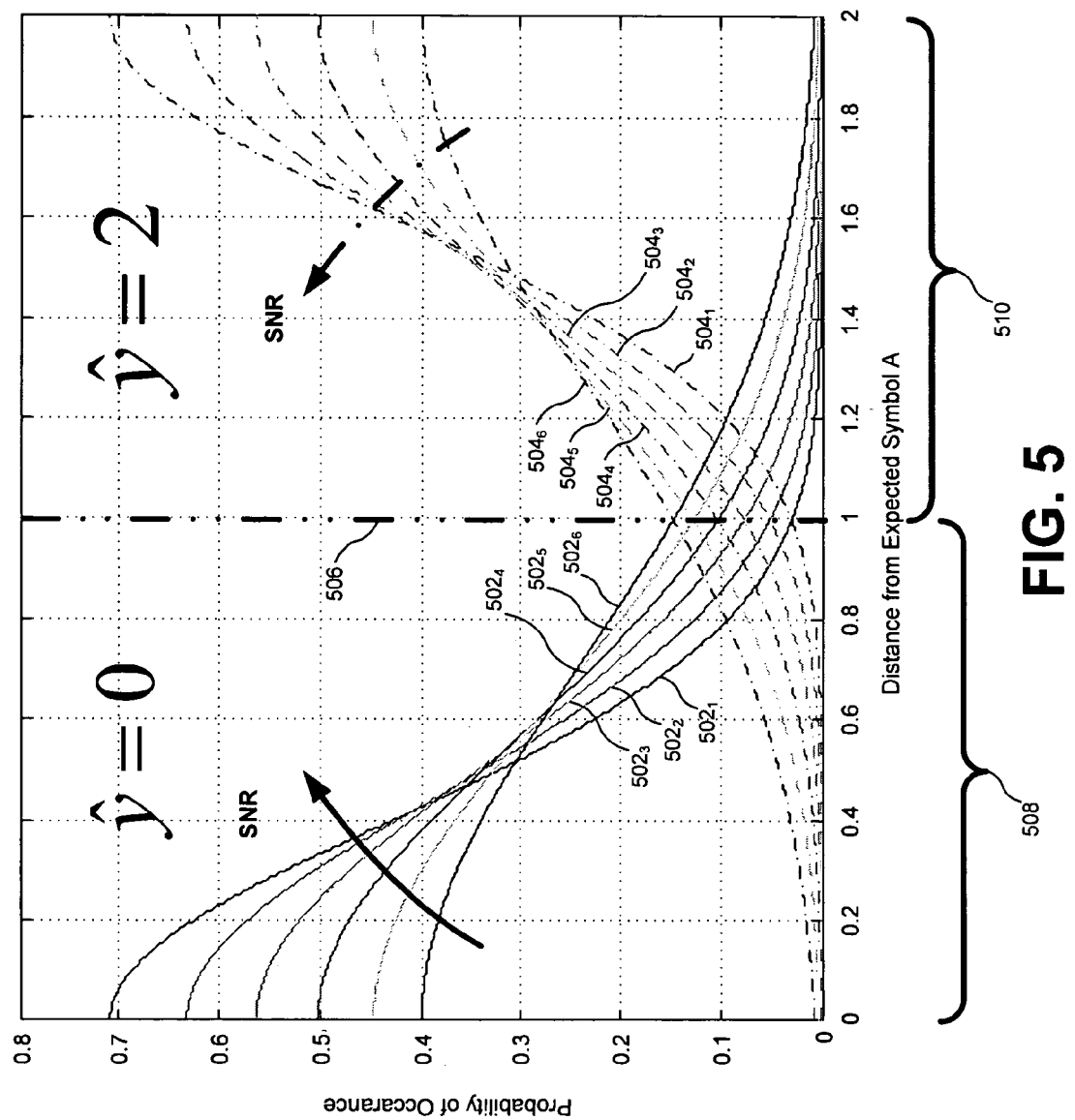
FIG. 5 is a graph illustrating a non-reduced constellation technique.

FIG. 5 provides a graph showing multiple probability density curves 502 (shown as solid curves). These curves represent probabilities that a received soft symbol 'y' (assuming 0<y<=2) corresponds to a transmitted symbol value of 0. Each curve 502 corresponds to a particular noise characteristic (SNR). Specifically, SNR increases from curve $502_1$ to curve $502_6$. The graph of FIG. 5 further shows multiple probability curves 504 (shown as dotted curves). These curves represent probabilities that a received soft symbol corresponds to a transmitted symbol value of 2. Like curves 502, each curve 504 corresponds to a particular noise characteristic. In particular, SNR increases from curve $504_1$ to curve $504_6$.

One technique of estimating a hard symbol, ŷ, from a soft symbol, y, (distributed, for example, according to the density curves of FIG. 5), is provided below in Expressions (6-1) and (6-2):

$$\text{If } 0 \leq y < 1 \xrightarrow{\text{then}} \hat{y} = 0 \tag{6-1}$$

$$\text{If } 1 \leq y \leq 2 \xrightarrow{\text{then}} \hat{y} = 2 \tag{6-2}$$

According to this technique, FIG. 5 shows a slicing boundary 506. This boundary separates contiguous soft symbol ranges 508 and 510. Thus, according to the technique of FIG. 5, when a 0 symbol is transmitted, a correct decision is made so long as the corresponding soft symbol (e.g., a soft symbol within soft symbol stream 234) is within soft symbol range 508 (in this case, 0≦y<1), and a wrong decision is made when the received symbol falls outside this range.

Thus, when symbol value of 0 is transmitted, the probability of making a correct decision is the integrated area under the corresponding SNR curve 502 from 0 to 1. Similarly, when a symbol value of 2 is transmitted, the probability of making a correct decision is the integrated area under the corresponding SNR curve 504 from 1 to 2. For Gaussian distributions, such probabilities are expressed below in Equations 7-1 and 7-2.

$$P[\text{correct decision}] = \text{erf}(1, \sigma_{SNR}) \tag{7-1}$$

$$\text{erf}(z, \sigma_{SNR}) = \frac{2}{\sigma_{SNR}\sqrt{2\pi}} \int_0^z e^{\frac{-x^2}{2\sigma_{SNR}^2}} dx \tag{7-2}$$

where $\sigma_{SNR} = S * 10^{-\frac{SNR}{20}}$, and $S^2$ represents the signal energy level.

In contrast, the probability of making the wrong decision is the integrated area under the solid curve from 1 to 2 (if the transmitted symbols was 0) or the area under the dotted curve from 0 to 1 (if the transmitted symbol was 2). Such probabilities are expressed below in Equations (8-1) and (8-2).

$$P[\text{wrong decision}] = cerf(1, \sigma_{SNR}) \quad (8\text{-}1)$$

$$cerf(z, \sigma_{SNR}) = \frac{2}{\sigma_{SNR}\sqrt{2\pi}} \int_z^\infty e^{\frac{-x^2}{2\sigma_{SNR}^2}} dx \quad (8\text{-}2)$$

where $\sigma_{SNR} = S * 10^{-\frac{SNR}{20}}$, and $S^2$ represents the signal energy level.

The above expressions demonstrate that, when employing slicing boundary 506, the probability of a correct decision decreases and the probability of a wrong decision increases as SNR decreases. This, in turn, generates incorrect error calculations, such as in error signal 240.

Figure 6:
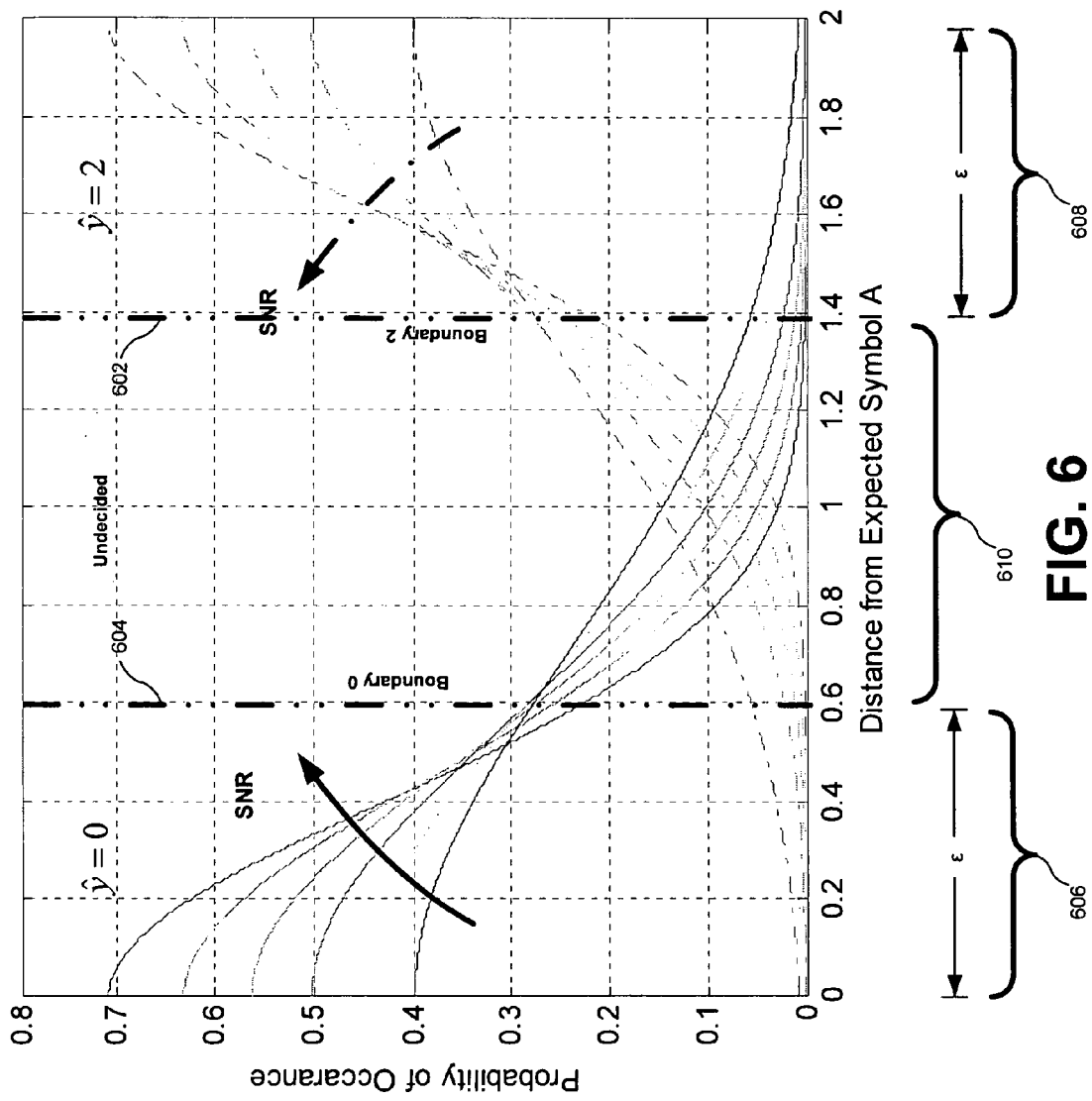
FIG. 6 is a graph illustrating a reduced constellation technique.

FIG. 6 is a graph illustrating an exemplary reduced constellation technique. This graph is similar to the graph of FIG. 5. However, instead of employing slicing boundary 506, slicing boundaries 602 and 604 are employed. Accordingly, FIG. 6 shows three ranges: a soft symbol range 606 corresponding to hard symbol 0, a soft symbol range 608 corresponding to hard symbol 1, and a soft symbol range 610 corresponding to a undecided symbol (i.e., neither hard symbol 0 or hard symbol 1). By employing such reduced boundaries, the probability of incorrectly determining hard symbols may be reduced. Reduced boundaries are described in greater detail below, where the symbol ε is used to represent particular reduced boundary values.

Figure 7:
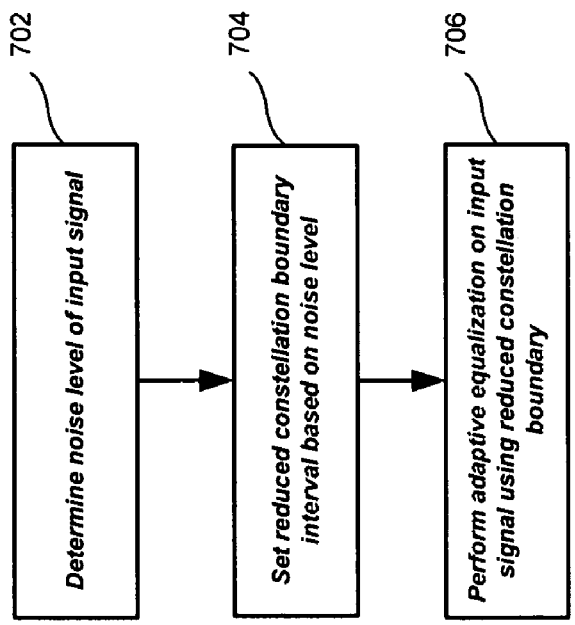
FIG. 7 illustrates one embodiment of a logic flow.

FIG. 7 illustrates one embodiment of a logic flow. In particular, FIG. 7 illustrates a logic flow 700, which may be representative of the operations executed by one or more embodiments described herein. As shown in FIG. 7, this flow includes a block 702, in which a noise level of an input signal is determined. This may involve, for example, estimating an SNR. Such estimations may include correlation operations with known signals. Noise determination may occur at various times. For instance noise levels may be determined at particular or predetermined time intervals.

Based on the determined noise level, a reduced constellation boundary interval is set at a block 704. This may involve changing the reduced constellation boundary interval in response to noise level changes.

One approach to setting the reduced constellation boundary interval may involve setting it so that certain probability ratio(s) are maintained. For instance, the boundary interval may be set in a manner that keeps the ratio of the probability of a correct decision to the probability of an incorrect decision greater than a particular threshold. This ratio is expressed below in Equation (9).

$$\frac{P[\text{correct}]}{P[\text{incorrect}]} \geq T_{ratio} \quad (9)$$

A further approach to setting the reduced constellation boundary interval may involve calculating so that certain probability difference(s) are maintained. For instance, the boundary interval may be set in a manner that keeps the difference between the probability of a correct decision and the probability of an incorrect decision greater than a particular threshold. This difference is expressed below in Equation (10).

$$P[\text{correct}] - P[\text{incorrect}] \geq T_{difference} \quad (10)$$

The probabilities in Equations (9) and (10) may be calculated, as expressed below in Equations (11) and (12).

$$P[\text{correct decision}] = erf(\varepsilon, \sigma_{SNR}) \quad (11)$$

$$= \frac{2}{\sigma_{SNR}\sqrt{2\pi}} \int_0^\varepsilon e^{\frac{-x^2}{2\sigma_{SNR}^2}} dx$$

$$P[\text{wrong decision}] = cerf(2-\varepsilon, \sigma_{SNR}) \quad (12)$$

$$= \frac{2}{\sigma_{SNR}\sqrt{2\pi}} \int_{2-\varepsilon}^\infty e^{\frac{-x^2}{2\sigma_{SNR}^2}} dx$$

Accordingly, through these approaches, the reduced boundary intervals through simulation. For instance, the reduced boundary threshold ($\varepsilon_{opt}$) according to the ratio approach may be determined as expressed below in Equation (13), while the threshold according to the difference approach may be determined as expressed below in Equation (14). The embodiments, however, are not limited to these approaches.

$$\varepsilon_{opt} = \max(\varepsilon) \text{ for } \frac{P[\text{correct}]}{P[\text{incorrect}]} \geq T_{ratio} \quad (13)$$

$$\varepsilon_{opt} = \max(\varepsilon) \text{ for } P[\text{correct}] - P[\text{incorrect}] \geq T_{difference} \quad (14)$$

With this reduced constellation boundary interval, adaptive equalization is performed on the input signal at a block 706. This may include, for example, generating a soft symbol associated with the input signal, and determining (based on the reduced constellation boundary interval and the soft symbol) whether to adapt coefficients of one or more equalization filters. For instance, the coefficients of the one or more equalization filters may be adapted when the soft symbol is within a reduced boundary according to the reduced constellation boundary interval. Such features advantageously enhance equalization (adaptive filtering) under low SNR conditions. For instance, such features prevent divergence from the removal of undesirable characteristics (e.g., multipath effects, ISI, etc.) in input signal 230.

Figure 8:
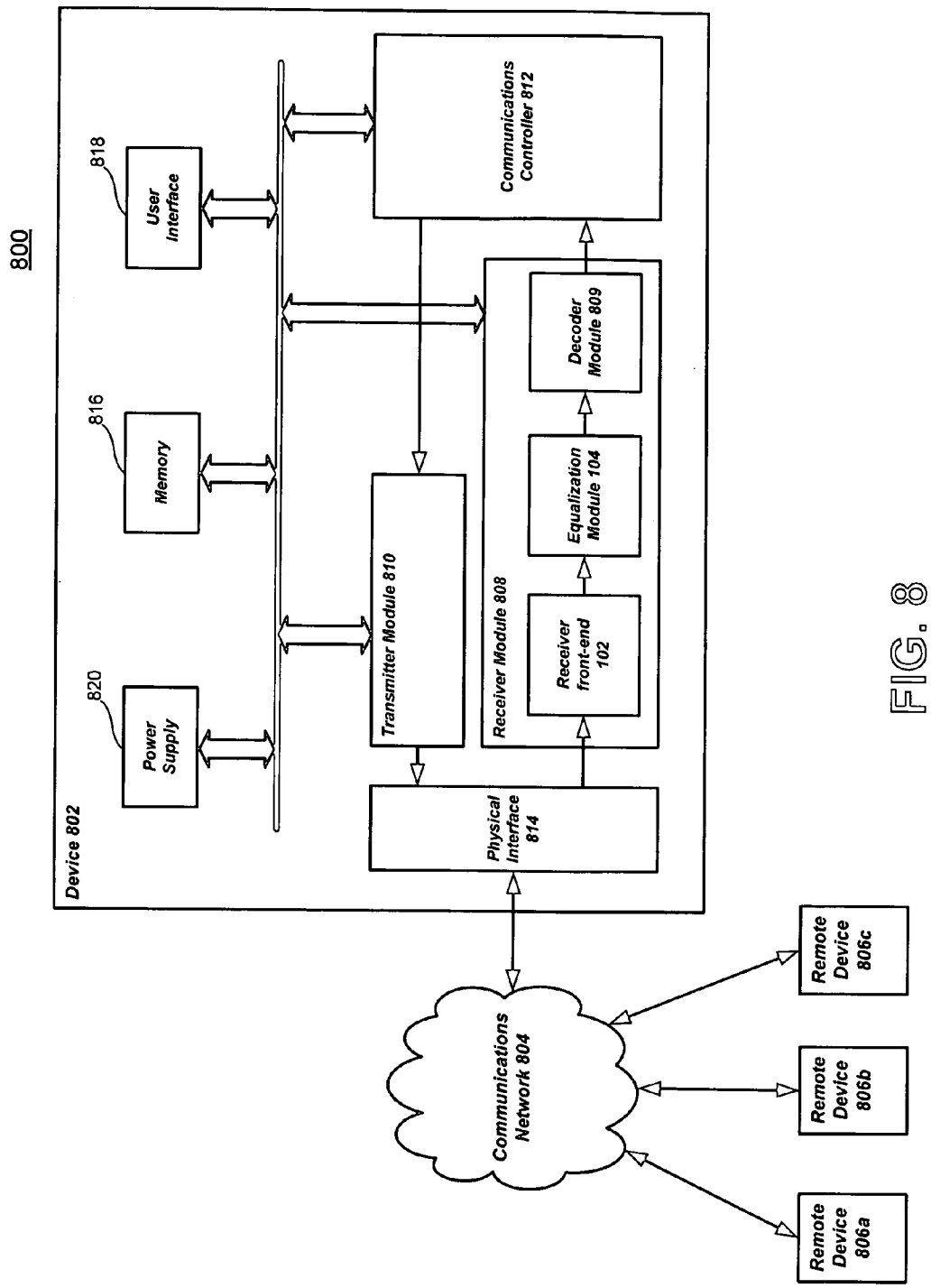
FIG. 8 illustrates one embodiment of a system.

FIG. 8 illustrates an embodiment of a system 800. This system may be representative of a system or architecture suitable for use with one or more embodiments described herein, such as with apparatus 100, implementation 200, logic flows 300 and 700, and so forth. Accordingly, system 800 may receive signals and perform equalization according to estimated noise levels, as described herein.

As shown in FIG. 8, system 800 may include a device 802, a communications network 804, and one or more remote devices 806. FIG. 8 shows that device 802 may include the elements of FIG. 1 within a receiver module 808. Also, receiver module 808 may include a decoder module 809. Moreover, device 802 may include a transmitter module 810, a communications controller 812, a physical interface 814, a memory 816, a user interface 818, and a power supply 820. These elements may be implemented in hardware, software, or any combination thereof. Moreover, these elements may be coupled according to various techniques. One such technique involves employment of one or more bus interfaces.

Within receiver module 808, decoder module 809 may receive symbols from equalization module 104 and perform decoding operations (e.g., error correction decoding and deinterleaving) on these symbols. For example, decoder module 809 may receive soft symbols from equalization module 104 and perform viterbi decoding and deinterleaving operations. Alternatively, decoder module 809 may receive hard symbols from equalization module 104 and perform suitable decoding operations on them.

Transmitter module 810 may prepare information for transmission across network 804. For example, transmitter module 810 may include components for various operations associated with the transmission of information. Examples of such operations may include encoding, modulation, upconversion, amplification, etc.

As shown in FIG. 8, communications controller 812 may be coupled to receiver module 808 and transmitter module 810. Communications controller 812 provides for the exchange of information with other devices across communications media, such as network 804. For instance, communications may receive such information from receiver module 808 and send such information to transmitter module 810. This information may be processed and exchanged with one or more user applications (not shown).

Communications controller 812 may provide for wireless or wired communications. For wireless communications, communications controller 812 may include components, such as control logic to perform operations according to one or more communications protocols. Thus, communications controller 812 may facilitate communications across wireless networks according to various protocols and/or formats. For example, device 802 and device(s) 806 may operate in accordance with various video transmission standards, such as those specified by the Advanced Television Systems Committee (ATSC) and/or the Digital Video Broadcasting (DVB) organization.

In addition, these devices may operate in accordance with various wireless local area network (WLAN) protocols, such as the IEEE 802.11 series of protocols, including the IEEE 802.11a, 802.11b, 802.11e, 802.11g, 802.11n, and so forth. In another example, these devices may operate in accordance with various wireless metropolitan area network (WMAN) mobile broadband wireless access (MBWA) protocols, such as a protocol from the IEEE 802.16 or 802.20 series of protocols. In another example, these devices may operate in accordance with various wireless personal area networks (WPAN). Such networks include, for example, IEEE 802.16e, Bluetooth, and the like. Also, these devices may operate according to Worldwide Interoperability for Microwave Access (WiMax) protocols, such as ones specified by IEEE 802.16. These protocols are provided merely as examples. Thus, the embodiments are not limited to such.

Also, these devices may employ wireless cellular protocols in accordance with one or more standards. These cellular standards may comprise, for example, Code Division Multiple Access (CDMA), CDMA 2000, Wideband Code-Division Multiple Access (W-CDMA), Enhanced General Packet Radio Service (GPRS), among other standards. The embodiments, however, are not limited in this context.

For wired communications, communications controller 812 may include components, such control logic to perform operations according to one or more communications protocols. Examples of such communications protocols include Ethernet (e.g., IEEE 802.3) protocols, integrated services digital network (ISDN) protocols, public switched telephone network (PSTN) protocols, and various cable protocols. The embodiments, however, are not limited to such.

Interface 814 provides a physical coupling to resource(s) of network 804. Accordingly, for wireless communications, interface 814 may include components, such as one or more antennas. For wired communications, physical interface 814 may include input/output (I/O) adapters, physical connectors to connect the I/O adapter with a corresponding wired communications medium. Examples of wired communications media may include a wire, cable, metal leads, printed circuit board (PCB), backplane, switch fabric, semiconductor material, twisted-pair wire, co-axial cable, fiber optics, and so forth.

Memory 816 may store information in the form of data. For instance, memory 816 may contain one or more reduced boundary intervals arranged in various ways (e.g., in a LUT). Also, memory 816 may store predetermined signals and/or sequences used for correlation to estimate noise levels. Further, memory 816 may store data conveyed during communications with remote device(s) 806. Examples of such data include information conveyed in signals received from network 804 and received by receiver module 808. For instance, with reference to FIG. 1, this information may be conveyed input signal 122.

However, the embodiments are not limited in this context.

Alternatively or additionally, memory 816 may store control logic, instructions, and/or software components. These software components include instructions that can be executed by a processor. Such instructions may provide functionality of one or more elements in system 800.

Memory 816 may be implemented using any machine-readable or computer-readable media capable of storing data, including both volatile and non-volatile memory. For example, memory 816 may include read-only memory (ROM), random-access memory (RAM), dynamic RAM (DRAM), Double-Data-Rate DRAM (DDRAM), synchronous DRAM (SDRAM), static RAM (SRAM), programmable ROM (PROM), erasable programmable ROM (EPROM), electrically erasable programmable ROM (EEPROM), flash memory, polymer memory such as ferroelectric polymer memory, ovonic memory, phase change or ferroelectric memory, silicon-oxide-nitride-oxide-silicon (SONOS) memory, magnetic or optical cards, or any other type of media suitable for storing information. It is worthy to note that some portion or all of memory 816 may be included in other elements of system 800. For instance, some or all of memory 816 may be included on a same integrated circuit or chip with such elements. Alternatively some portion or all of memory 816 may be disposed on a medium, for example a hard disk drive, which is external. The embodiments are not limited in this context.

User interface 818 facilitates user interaction with device 802. This interaction may involve the input of information from a user and/or the output of information to a user. Accordingly, user interface 818 may include one or more devices, such as a keypad, a touch screen, a microphone, and/or an audio speaker. In addition, user interface 818 may include a display to output information and/or render images/video processed by device 802. Such images may correspond to signals received from network 804 and received by receiver module 808. For instance, with reference to FIG. 1, these images may correspond to input signal 122. Exemplary displays include liquid crystal displays (LCDs), plasma displays, and video displays.

Power supply 820 provides operational power to elements of device 802. Accordingly, power supply 820 may include an interface to an external power source, such as an alternating current (AC) source. Additionally or alternatively, power supply 820 may include a battery. Such a battery may be removable and/or rechargeable. However, the embodiments are not limited to this example.

Numerous specific details have been set forth herein to provide a thorough understanding of the embodiments. It will be understood by those skilled in the art, however, that the embodiments may be practiced without these specific details. In other instances, well-known operations, components and circuits have not been described in detail so as not to obscure the embodiments. It can be appreciated that the specific structural and functional details disclosed herein may be representative and do not necessarily limit the scope of the embodiments.

Various embodiments may be implemented using hardware elements, software elements, or a combination of both. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth. Examples of software may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints.

Some embodiments may be described using the expression "coupled" and "connected" along with their derivatives. These terms are not intended as synonyms for each other. For example, some embodiments may be described using the terms "connected" and/or "coupled" to indicate that two or more elements are in direct physical or electrical contact with each other. The term "coupled," however, may also mean that two or more elements are not in direct contact with each other, but yet still co-operate or interact with each other.

Some embodiments may be implemented, for example, using a machine-readable medium or article which may store an instruction or a set of instructions that, if executed by a machine, may cause the machine to perform a method and/or operations in accordance with the embodiments. Such a machine may include, for example, any suitable processing platform, computing platform, computing device, processing device, computing system, processing system, computer, processor, or the like, and may be implemented using any suitable combination of hardware and/or software. The machine-readable medium or article may include, for example, any suitable type of memory unit, memory device, memory article, memory medium, storage device, storage article, storage medium and/or storage unit, for example, memory, removable or non-removable media, erasable or non-erasable media, writeable or re-writeable media, digital or analog media, hard disk, floppy disk, Compact Disk Read Only Memory (CD-ROM), Compact Disk Recordable (CD-R), Compact Disk Rewriteable (CD-RW), optical disk, magnetic media, magneto-optical media, removable memory cards or disks, various types of Digital Versatile Disk (DVD), a tape, a cassette, or the like. The instructions may include any suitable type of code, such as source code, compiled code, interpreted code, executable code, static code, dynamic code, encrypted code, and the like, implemented using any suitable high-level, low-level, object-oriented, visual, compiled and/or interpreted programming language.

Unless specifically stated otherwise, it may be appreciated that terms such as "processing," "computing," "calculating," "determining," or the like, refer to the action and/or processes of a computer or computing system, or similar electronic computing device, that manipulates and/or transforms data represented as physical quantities (e.g., electronic) within the computing system's registers and/or memories into other data similarly represented as physical quantities within the computing system's memories, registers or other such information storage, transmission or display devices. The embodiments are not limited in this context.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. An apparatus, comprising:
a noise calculation module to determine a noise level of an input signal;
a boundary setting module to store multiple boundary intervals, wherein each boundary interval corresponds to a particular noise level and to set a reduced constellation boundary interval based on the noise level; and
an equalizer to perform adaptive equalization on the input signal in accordance with the reduced constellation boundary interval wherein the equalizer comprises a slicer to generate a hard symbol associated with the input signal; and
wherein the boundary setting module is to set the reduced constellation boundary interval such that at least one of a probability ratio or a probability difference is greater than a respective predetermined threshold:
wherein the probability ratio is a ratio of a probability of the one or more hard symbols being correct to a probability of the one or more hard symbols being incorrect; and
wherein the probability difference is a difference between a probability of the hard symbol being correct and a probability of the hard symbol being incorrect is greater than a predetermined threshold.

2. The apparatus of claim 1, wherein the equalizer comprises:
one or more filters, each having a plurality of coefficients; and
a decision module to determine, based on the reduced constellation boundary interval and one or more soft symbols associated with the input signal, whether to adapt the coefficients of the one or more filters.

3. The apparatus of claim 1, wherein the boundary setting module comprises a plurality of stored boundary intervals for selection as the reduced constellation boundary interval, each stored boundary interval corresponding to a range of noise levels.

4. The apparatus of claim 1, comprising an antenna to receive a wireless signal corresponding to the input signal.

5. The apparatus of claim 1, comprising a display to display one or more images corresponding to the input signal.

6. The apparatus of claim 1, comprising memory to store information conveyed in the input signal.

7. The apparatus of claim 1, comprising memory to store a plurality of boundary intervals for selection as the reduced constellation boundary interval, each stored boundary interval corresponding to a range of noise levels.

8. An apparatus, comprising:
a noise calculation module to determine a noise level of an input signal;
a slicer to generate a hard symbol associated with the input signal;
a boundary setting module to set a reduced constellation boundary interval based on the noise level, the boundary setting module including a plurality of stored boundary intervals for selection as the reduced constellation boundary interval, wherein each stored boundary interval corresponds to a range of noise levels;
one or more filters, each having a plurality of coefficients; and
a decision module to determine, based on the reduced constellation boundary interval and one or more soft symbols associated with the input signal, whether to adapt the coefficients of the one or more filters;
wherein the boundary setting module is to set the reduced constellation boundary interval such that at least one of a probability ratio or a probability difference is greater than a respective predetermined threshold:
wherein the probability ratio is a ratio of a probability of the one or more hard symbols being correct to a probability of the one or more hard symbols being incorrect; and
wherein the probability difference is a difference between a probability of the hard symbol being correct and a probability of the hard symbol being incorrect is greater than a predetermined threshold.

9. A computer-implemented method, comprising:
determining a noise level of an input signal in a noise calculation module;
generating a hard symbol associated with the input signal in a slicer;
storing multiple boundary intervals, wherein each boundary interval corresponds to a particular noise level;
setting a reduced constellation boundary interval from the stored multiple boundary levels based on the noise level in a boundary setting module such that at least one of a probability ratio or a probability difference is greater than a predetermined threshold:
wherein the probability ratio is a ratio of a probability of the one or more hard symbols being correct to a probability of the one or more hard symbols being incorrect; and
wherein the probability difference is a difference between a probability of the hard symbol being correct and a probability of the hard symbol being incorrect is greater than a predetermined threshold; and
performing adaptive equalization on the input signal in accordance with the reduced constellation boundary interval in a decision module.

10. The method of claim 9, wherein performing adaptive equalization on the input signal in accordance with the reduced constellation boundary interval comprises:
generating a soft symbol associated with the input signal;
determining, based on the reduced constellation boundary interval and the soft symbol, whether to adapt coefficients of one or more equalization filters.

11. The method of claim 9, wherein performing adaptive equalization on the input signal in accordance with the reduced constellation boundary interval comprises:
generating a soft symbol associated with the input signal;
adapting coefficients of one or more equalization filters when the soft symbol is within a reduced boundary according to the reduced constellation boundary interval; and
refraining from adaptation of the coefficients of the one or more equalization filters when the soft symbol is outside a reduced boundary according to the reduced constellation boundary interval.

12. The method of claim 9, wherein setting the reduced constellation boundary interval comprises changing the reduced constellation boundary interval in response to a change in the noise level.

13. The method of claim 9, wherein determining the noise level of the input signal is performed at predetermined time intervals.

14. An article comprising a machine-readable storage medium containing instructions that if executed enable a system to:
determine a noise level of an input signal;
generate a hard symbol associated with the input signal;
store multiple boundary intervals, wherein each boundary interval corresponds to a particular noise level;
set a reduced constellation boundary interval from the stored multiple boundary levels based on the noise level such that at least one of a probability ratio or a probability difference is greater than a predetermined threshold:
wherein the probability ratio is a ratio of a probability of the one or more hard symbols being correct to a probability of the one or more hard symbols being incorrect; and
wherein the probability difference is a difference between a probability of the hard symbol being correct and a probability of the hard symbol being incorrect is greater than a predetermined threshold; and
perform adaptive equalization on the input signal in accordance with the reduced constellation boundary interval.

15. The article of claim 14, comprising instructions that if executed enable the system to:
generate a soft symbol associated with the input signal;
determine, based on the reduced constellation boundary interval and the soft symbol, whether to adapt coefficients of one or more equalization filters.

16. The article of claim 14, comprising instructions that if executed enable the system to:
adapt coefficients of one or more equalization filters when the soft symbol is within a reduced boundary according to the reduced constellation boundary interval; and
refrain from adapting the coefficients of the one or more equalization filters when the soft symbol is outside a reduced boundary according to the reduced constellation boundary interval.

17. The article of claim 14, comprising instructions that if executed enable the system to change the reduced constellation boundary interval in response to a change in the noise level.

18. The article of claim 14, comprising instructions that if executed enable the system to determine the noise level of the input signal at predetermined time intervals.

* * * * *